(12) United States Patent
Morse

(10) Patent No.: US 6,653,161 B1
(45) Date of Patent: Nov. 25, 2003

(54) METHOD AND APPARATUS FOR FORMING A CAPACITIVE STRUCTURE INCLUDING SINGLE CRYSTAL SILICON

(75) Inventor: Michael T. Morse, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/147,631

(22) Filed: May 16, 2002

(51) Int. Cl.$^7$ ............................................... H01L 21/00

(52) U.S. Cl. ..................... 438/31; 438/32; 438/39; 438/41; 438/388; 438/481

(58) Field of Search .............................. 438/29, 31, 32, 438/39, 41, 388, 481; 359/248; 385/2, 3

(56) References Cited

U.S. PATENT DOCUMENTS

| | | | | |
|---|---|---|---|---|
| 4,845,725 A | * | 7/1989 | Welch et al. | 372/46 |
| 6,470,104 B2 | * | 10/2002 | Paniccia et al. | 385/16 |
| 6,483,954 B2 | * | 11/2002 | Koehl et al. | 385/2 |
| 2003/0077037 A1 | * | 4/2003 | Ovadia et al. | 385/37 |

OTHER PUBLICATIONS

Schaub, J.D., et al., "Resonant–Cavity–Enhanced High-–Speed Si Photodiode Grown by Epitaxial Lateral Overgrowth,"0 IEEE Photonics Technology Letters, vol. 11, No. 12, Dec., 1999, pp. 1647–1649.

* cited by examiner

*Primary Examiner*—George Eckert
*Assistant Examiner*—N. Drew Richards
(74) *Attorney, Agent, or Firm*—Blakely, Sokoloff, Taylor & Zafman LLP

(57) ABSTRACT

A capacitive structure including single crystal silicon and an insulating layer in a semiconductor substrate. One embodiment of the present invention includes an optical switching device having one or more capacitive structures including single crystal silicon in a substrate such as a silicon-on-insulator (SOI) wafer and can be used in a variety of high bandwidth applications including multi-processor, telecommunications, networking or the like. In one embodiment, a capacitive structure includes single crystal silicon disposed in a first semiconductor material with an insulating layer disposed between the single crystal silicon and the semiconductor material. In one embodiment, a capacitive structure may be formed by laterally growing single crystal silicon through an opening in a trench adjacent to a trench where the capacitive structures is formed.

14 Claims, 7 Drawing Sheets

US 6,653,161 B1

METHOD AND APPARATUS FOR FORMING A CAPACITIVE STRUCTURE INCLUDING SINGLE CRYSTAL SILICON

BACKGROUND OF THE INVENTION

1. Field of the Invention

The present invention relates generally to optical devices and, more specifically, the present invention relates to capacitive structures usable in optical devices.

2. Background Information

The need for fast and efficient optical switches is increasing as Internet data traffic growth rate is overtaking voice traffic pushing the need for optical communications. Three commonly found types of optical switches are mechanical switching devices, thermal switching devices and electro-optic switching devices.

Mechanical switching devices generally involve physical components that are placed in the optical paths between optical fibers. These components are moved to cause switching action. Micro-electronic mechanical systems (MEMS) have recently been used for miniature mechanical switches. MEMS are popular because they are silicon based and are processed using somewhat conventional silicon processing technologies. However, since MEMS technology generally rely upon the actual mechanical movement of physical parts or components, MEMS are generally limited to slower speed optical applications, such as for example applications having response times on the order of milliseconds.

Thermal switching devices rely on a temperature-induced change of the refractive index to switch the light. This approach is popular because almost all materials exhibit this behavior. The disadvantage for them is the time it takes to warm and cool the devices to get them to switch. Typical times are on the order of milliseconds.

In electro-optic switching devices, voltages are applied to selected parts of a device to create electric fields within the device. The electric fields change the optical properties of selected materials within the device and the electro-optic effect results in switching action. Electro-optic devices typically utilize electro-optical materials that combine optical transparency with voltage-variable optical behavior. One typical type of single crystal electro-optical material used in electro-optic switching devices is lithium niobate ($LiNbO_3$).

Although the switching speeds of these types of devices are very fast, for example on the order of nanoseconds, one disadvantage with present day electro-optic switching devices is that these devices generally require relatively high voltages in order to switch optical beams. Consequently, the external circuits utilized to control present day electro-optical switches are usually specially fabricated to generate the high voltages and suffer from large amounts of power consumption. In addition, integration of these external high voltage control circuits with present day electro-optical switches is becoming an increasingly challenging task as device dimensions continue to scale down and circuit densities continue to increase.

BRIEF DESCRIPTION OF THE DRAWINGS

The present invention is illustrated by way of example and not limitation in the accompanying figures.

DETAILED DESCRIPTION

Methods and apparatuses for forming a capacitive structure including single crystal silicon are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

One embodiment of the present invention includes an optical switching device having one or more capacitive structures including single crystal silicon in a substrate such as a silicon-on-insulator (SOI) wafer and can be used in a variety of high bandwidth applications including multi-processor, telecommunications, networking or the like. In one embodiment, the SOI wafer includes a first semiconductor material in a substrate, the substrate including a buried insulating layer proximate to the first semiconductor material. In one embodiment, a capacitive structure includes single crystal silicon disposed in the first semiconductor material with an insulating layer disposed between the single crystal silicon and the first semiconductor material. In one embodiment, the capacitive structure may be formed by laterally growing single crystal silicon through an opening in a trench adjacent to a trench where the capacitive structure is formed.

In one embodiment, one or more capacitive structures may be included in an optical switching device. In an embodiment, the optical switching device is used to modulate an optical beam and includes capacitive structures disposed in a semiconductor material. In one embodiment, optical insulating layers and/or regions are employed to help confine an optical beam to pass through an array of waveguides. In one embodiment, the array of such waveguides, each containing capacitive structures, may also be referred to as a phase array and may be used to switch, modulate, route, etc. an optical beam in accordance with the teachings of the present invention.

Figure 1:
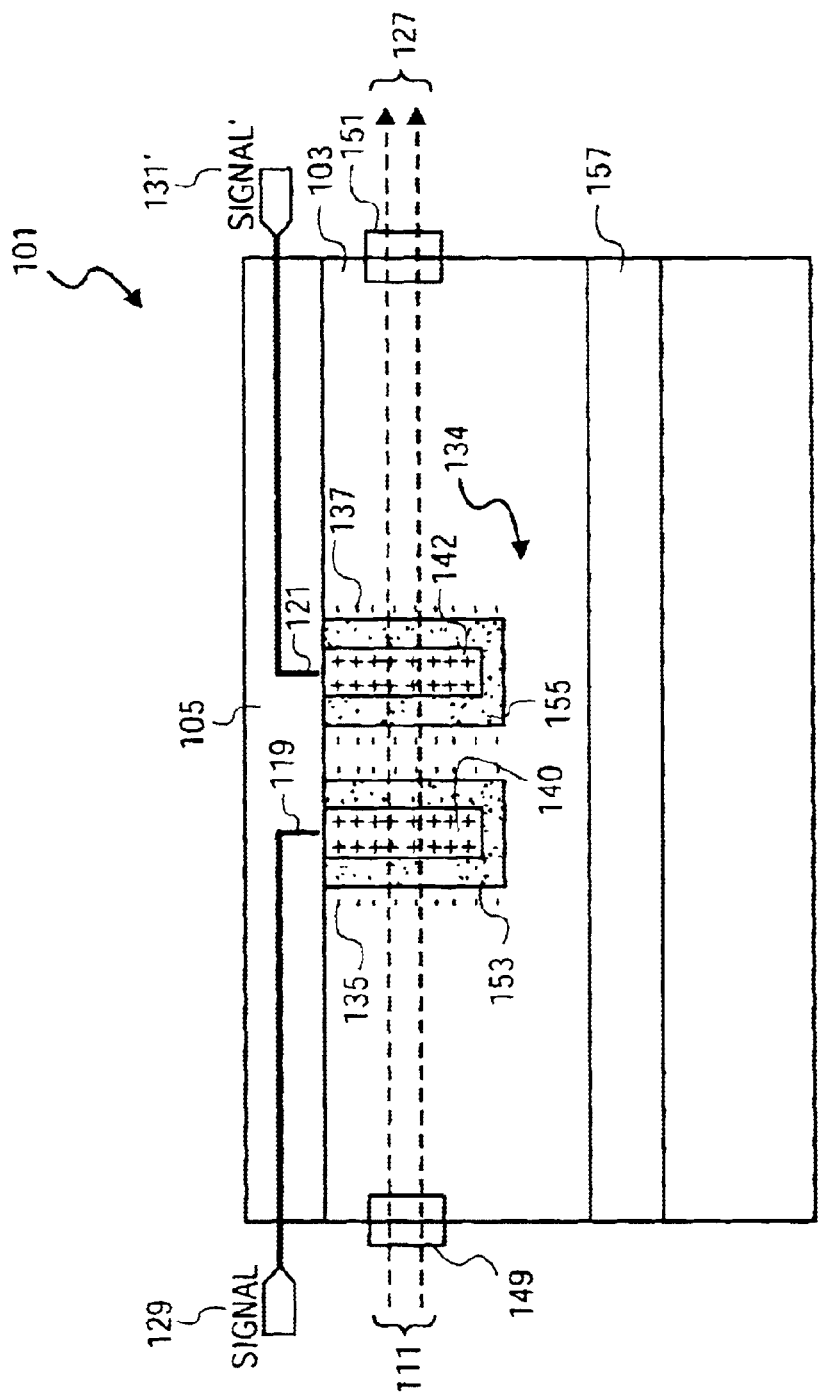
FIG. 1 is a side view illustration of one embodiment of an optical switching device having one or more capacitive structures in accordance with the teachings of the present invention.

FIG. 1 is a side view illustration of one embodiment of an optical switch 101 including an optical switching device 134 disposed in a first semiconductor material 103 included in a substrate in accordance with the teachings of the present invention. In one embodiment, optical switching device 134 includes one or more capacitive structures including capacitive structure 135 and capacitive structure 137, as illustrated in FIG. 1. In one embodiment, capacitive structures 135 and 137 include single crystal silicon regions 140 and 142, respectively. In one embodiment, first semiconductor material 103 includes silicon. In other embodiments, other suitable semiconducting materials can be used including for example, but not limited to, indium phosphide (InP), gallium arsenide (GaAs) and other III–V materials or the like. As shown in FIG. 1, one embodiment of optical switch 101 includes an insulating layer 153 disposed between single crystal silicon region 140 of capacitive structure 135 and first semiconductor material 103. Similarly, an insulating layer 155 is disposed between single crystal silicon region 142 of capacitive structure 137 and first semiconductor material 103. In one embodiment, first semiconductor material 103 has an index of refraction very similar, if not identical to the index of refraction of regions 140 and 142. In one embodiment, first and second insulating layers 105 and 157 are disposed along an optical path, first insulating layer 105 disposed opposite to second insulating layer 157 across the optical path.

As illustrated in FIG. 1, one embodiment of optical switch 101 includes an optical input port 149 and an optical output port 151 disposed in or optically coupled to first semiconductor material 103 on different sides of the capacitive structures 135 and 137 of optical switching device 134. In one embodiment, an optical beam 111 is directed through optical input port 149 and through first semiconductor material 103 to the capacitive structures 135 and 137 of optical switching device 134. In one embodiment, optical beam 111 is directed into optical input port 149 through an optical waveguide, fiber or the like. In one embodiment, optical beam 111 includes infrared or near infrared laser light. As known to those skilled in the art, silicon is partially transparent to infrared or near infrared light. For instance, in one embodiment in which optical switch 101 is utilized in telecommunications, optical beam 111 has an infrared wavelength of approximately 1.55 or 1.3 micrometers.

In one embodiment, a signal 129 and a signal' 131 are coupled to be received by capacitive structures 135 and 137, respectively, of optical switching device 134. In one embodiment, signal 129 and signal' 131 are generated by control circuitry on an integrated circuit die of optical switch 101. In one embodiment, the control circuit generating signal 129 and signal' 131 is disposed in semiconductor material 103 outside of the optical path between optical input port 149 and optical output port 151. In another embodiment, signal 129 and signal' 131 are generated by control circuitry external to the integrated circuit die of optical switch 101. In one embodiment, signal 129 and signal' 131 are coupled to be received by capacitive structures 135 and 137 through signal lines or conductors 119 and 121, which are disposed in first insulating layer 105 of optical switch 101. In one embodiment, first insulating layer 105 is an oxide and includes a dielectric layer of optical switch 101.

In one embodiment, signal 129 and signal' 131 are a plurality of signals separately coupled to be received by capacitive structures 135 and 137 in optical switching device 134. For example, in one embodiment, signal 129 and signal' 131 are the same signals having opposite polarities. In another embodiment, signal 129 and signal' 131 are the same signals having the same polarities. In yet another embodiment, signal 129 and signal' 131 are separate signals coupled to capacitive structures across the array to control or modulate a charge distribution of free charge carriers across the capacitive structures 135 and 137.

As will be discussed, optical beam 111 is switched or modulated by the capacitive structures 135 and 137 of optical switching device 134 in one embodiment. A switched optical beam 127 is then directed from the capacitive structures 135 and 137 through semiconductor material 103 to optical output port 151. In one embodiment, switched optical beam 127 is directed from optical output port 151 through an optical fiber or the like.

In one embodiment, first semiconductor material 103 is doped to include free charge carriers. In one embodiment, first semiconductor material 103 is n-type doped silicon and the free charge carriers are electrons. In another embodiment, semiconductor material 103 is p-type doped silicon and the free charge carriers are holes. In one embodiment, the single crystal silicon regions of trench capacitors 135 and 137 include n-type doped single crystal silicon and the free charge carriers are electrons. In another embodiment, the single crystal silicon regions of trench capacitors 135 and 137 include p-type doped single crystal silicon and the free charge carriers are holes.

In one embodiment, the free charge carriers attenuate optical beam 111 when passing through first semiconductor material 103. In particular, the free charge carriers attenuate optical beam 111 by converting some of the energy of optical beam 111 into free charge carrier energy. By utilizing single crystal silicon in regions 140 and 142 of capacitive structures 135 and 137 in accordance with the teachings of the present invention, loss or attenuation of optical beam 111 may be reduced as optical beam 111 travels through capacitive structures 135 and 137. Single crystal silicon requires a lesser concentration of dopants for electrical activation when compared with many similar materials used in CMOS processes, such as poly-silicon, thus leading to lower optical loss when capacitors 135 and 137 are used in optical devices such as the switching device illustrated in FIG. 1

Figure 2:
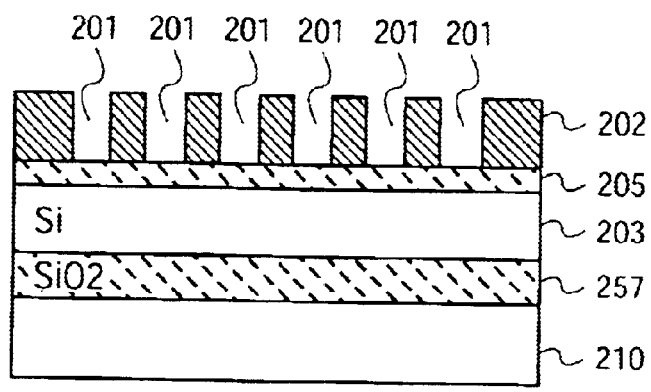
FIGS. 2–10 illustrate an embodiment of a process involving lateral growth of single crystal silicon to form capacitive structures similar to those included in the optical switching device illustrated in FIG. 1 in accordance with the teachings of the present invention.

In the depicted embodiment, capacitive structures 135 and 137 are biased in response to signal voltages such that the concentration of free charge carriers in charged regions of capacitive structures is modulated. In one embodiment, capacitive structures 135 and 137 are operated in accumulation mode. Thus, if the single crystal silicon regions of capacitive structures 135 and 137 include p-type silicon and first semiconductor material 103 includes n-type silicon and a positive charge is applied to capacitive structures 135 and 137, holes and electrons are clustered in charged regions as shown in FIG. 2. Similarly if the single crystal silicon regions of capacitive structures 135 and 137 include n-type silicon and first semiconductor material 103 includes p-type silicon and a negative charge is applied to capacitive structures, electrons and holes are clustered in the charged regions. In other embodiments, it is appreciated that capacitive structures 135 and 137 may be operated in other modes such as for example depletion or inversion. It is appreciated that by operating in accumulation mode, higher switching speeds for capacitive structures 135 and 137 may be realized.

In another embodiment, an optical beam 111 is directed through first semiconductor material 103 such that a portion of optical beam 111 is directed to pass through the modulated charge regions and a portion of optical beam 111 is not directed to pass through the modulated charge regions (not shown). As a result of the modulated charge concentration in charged regions, optical beam 111 is switched resulting in switched optical beam 127 being directed from the capacitive structures through semiconductor material 103.

In one embodiment, the phase of the portion of optical beam 111 that passes through the charged regions is modulated in response to the signal. In one embodiment, the phase of optical beam 111 passing through free charge carriers in the charged regions is modulated due to the plasma optical effect. The plasma optical effect arises due to an interaction between the optical electric field vector and free charge carriers that may be present along the propagation path of the optical beam 111. The electric field of the optical beam 111 polarizes the free charge carriers and this effectively perturbs the local dielectric constant of the medium. This in turn leads to a perturbation of the propagation velocity of the optical wave and hence the refractive index for the light, since the refractive index is simply the ratio of the speed of the light in vacuum to that in the medium. The free charge carriers are accelerated by the field and also lead to absorption of the optical field as optical energy is used up. Generally the refractive index perturbation is a complex number with the real part being that part which causes the velocity change and the imaginary part being related to the free charge carrier absorption. The amount of phase shift $\phi$ is given by $$\phi = (2\pi/\lambda)\Delta nL \quad \text{(Equation 1)}$$

with the optical wavelength $\lambda$ and the interaction length L. In the case of the plasma optical effect in silicon, the refractive index change $\Delta n$ due to the electron ($\Delta N_e$) and hole ($\Delta N_h$) concentration change is given by:

$$\Delta n = -\frac{e^2 \lambda^2}{8\pi^2 c^2 \varepsilon_0 n_0} \left( \frac{b_e (\Delta N_e)^{1.05}}{m_e^*} + \frac{b_h (\Delta N_h)^{0.8}}{m_h^*} \right) \quad \text{(Equation 2)}$$

where $n_o$ is the nominal index of refraction for silicon, e is the electronic charge, c is the speed of light, $\varepsilon_o$ is the permittivity of free space, $m_e^*$ and $m_h^*$ are the electron and hole effective masses, respectively, $b_e$ and $b_h$ are fitting parameters.

In another embodiment, the amount of phase shift $\phi$ of some portions of optical beam 111 passing through the free charge carriers of charged regions is approximately $\lambda/2$. In one embodiment, the phase of a portion of optical beam 111 not passing though the free charge carriers of charged regions, i.e. passing through uncharged regions, is relatively unchanged. In one embodiment, a resulting interference occurs between the phase modulated portions and non-phase modulated portions of optical beam 111 passing through the capacitive structures 135 and 137.

It is noted that optical switch 101 has been illustrated in FIG. 1 with two capacitive structures 135 and 137. It is appreciated that in other embodiments, optical switch 101 may include a greater or fewer number of capacitive structures in accordance with the teachings of the present invention with the number of capacitive structures chosen to achieve the required phase shift. In particular, the interaction length L discussed in connection with Equation 1 above may be varied by increasing or decreasing the total number of capacitive structures 135 and 137 in optical switching device 134 of optical switch 101. In one embodiment, as will be shown in FIGS. 2–10, an optical device may include for example, six capacitive structures.

In one embodiment, optical switch 101 is constructed on an SOI wafer. In one embodiment, capacitive structures 135 and 137 are fabricated to be approximately 1–2 $\mu$m deep. In other embodiments, capacitive structures 135 and 137 may be fabricated 5 $\mu$m deep or other suitable depths in accordance with the teachings of the present invention.

FIGS. 2–10 illustrate an embodiment of a process used to form an optical device, having capacitive structures included for example in the switching devices illustrated in FIG. 1 in accordance with the teachings of the present invention. FIG. 2 illustrates a side view of a substrate 200 that in one embodiment includes an SOI wafer. In one embodiment, substrate 200 includes a substrate including a first semiconductor material 203 disposed between a first and second insulating layer, 205 and 257, respectively. Second insulating layer 257 is disposed between the first semiconductor material 203 and a second semiconductor material 210.

In FIG. 2, a photoresist layer 202 has been deposited over first insulating layer 205. In one embodiment, photoresist layer 202 has been deposited via a spin-on deposition process to define areas in which one or more trenches will be etched. As shown in the depicted embodiment, photoresist layer 202 has been patterned and etched to create one or more trenches 201 exposing discrete transverse sections of first insulating layer 205. In one embodiment, the patterning is done using standard lithographic techniques well known in the art, which typically comprise depositing layers of the correct materials on the device, applying a photoresist on the wafer, exposing the photoresist in areas to be added (light mask) or removed (dark mask) and then performing the appropriate etch. In one embodiment, a hard mask may also be used to etch trenches 201.

In one embodiment, the patterning is carried out using the lithographic process described above although other patterning processes such as ablation, ruling, or other techniques will be apparent to those skilled in the art. The etching can be carried out using either a dry or a wet process, and varieties of both wet and dry etching will be apparent to those skilled in the art and may be dependent upon the materials used for photoresist layer 202 and first insulating layer 205.

Figure 3:
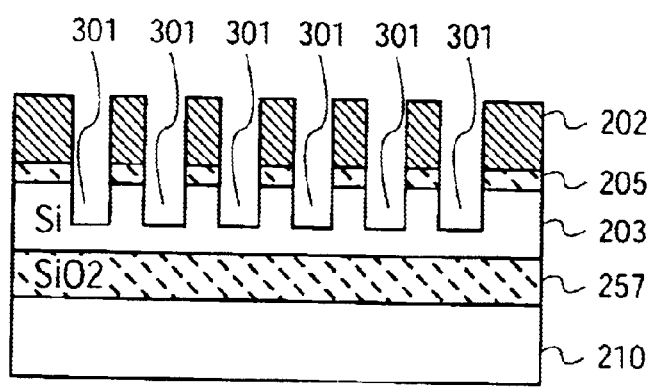

Next, as illustrated in FIG. 3, one or more trenches 301 are etched in first insulating layer 205 and first semiconductor material 203 by selective wet or dry etching. In one embodiment, first insulating layer 205 serves as a hard mask over first semiconductor material 203. In one embodiment, first insulating layer 205 includes oxide or other insulating material. Again, a lithographic patterning process may be used and wet or dry etching processes may be used.

Figure 5:
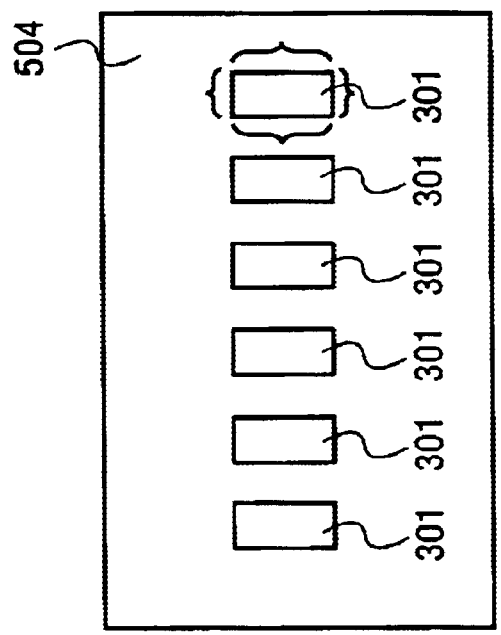
Figure 4:
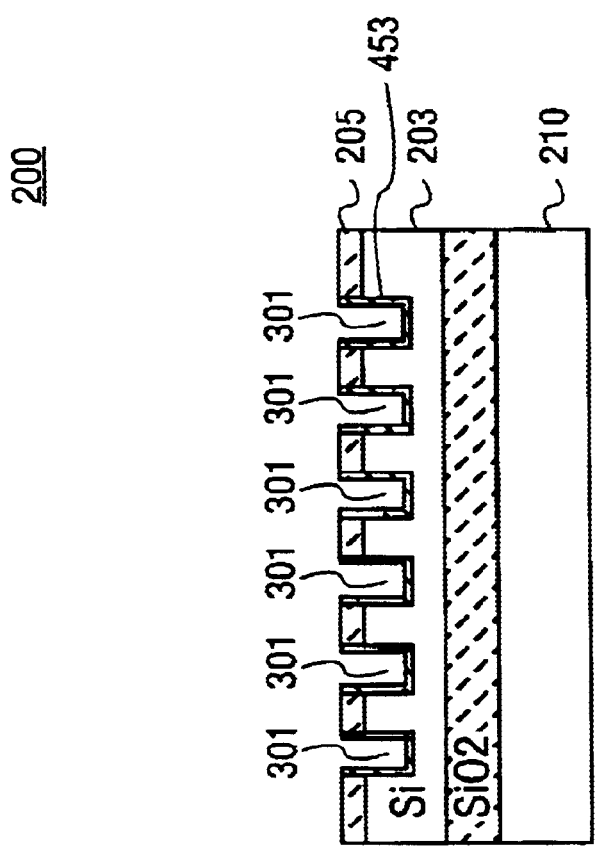

In FIG. 4, photoresist layer 202 has been removed and an insulating layer 453 is grown on an inside surface of trenches 301 to form a plurality of interfaces between insulating layer 453 and first semiconductor material 203. For clarity, only one insulating layer 453 is labeled in FIG. 4, although each of the trenches 301 includes a similar insulating layer on the inside surface of each trench 301. In one embodiment, insulating layer 453 includes an oxide. FIG. 5 illustrates a top view of substrate shown in FIG. 4. Trenches 301 are defined by a plurality of interfaces between insulating layer 453 and semiconductor material 203. In one embodiment, the plurality of interfaces includes a plurality of vertical interfaces 504.

Figure 7:
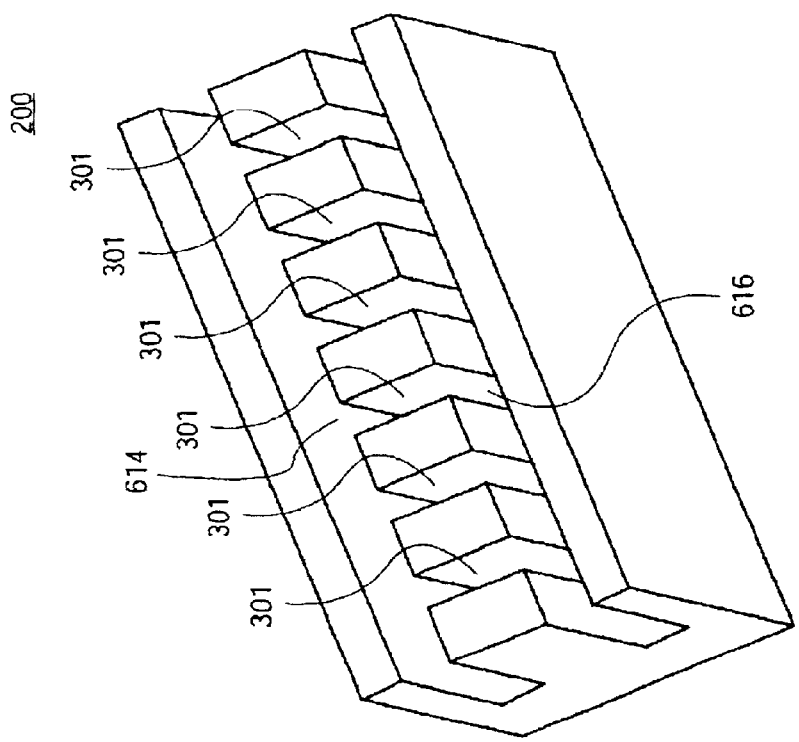
Figure 6:
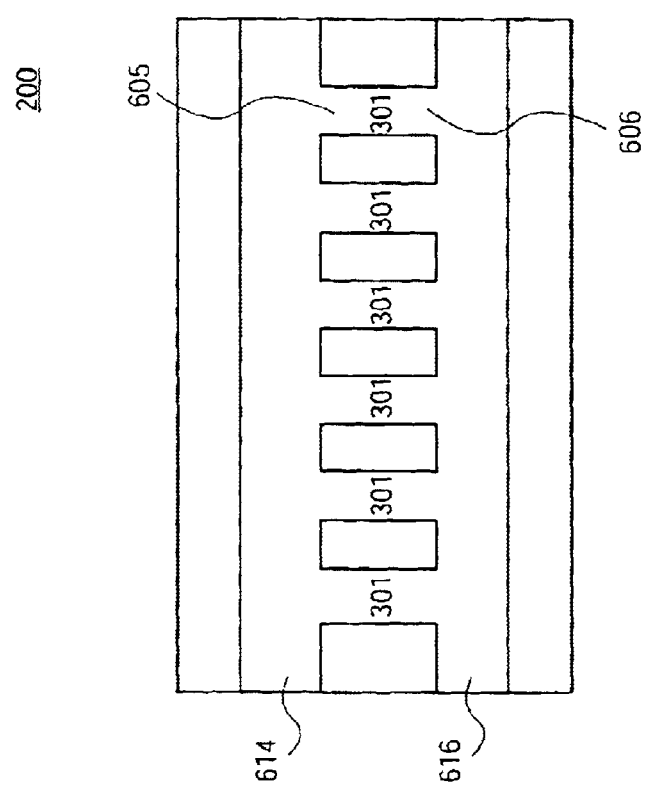

Next, in an embodiment of the invention; an additional one or more trenches are etched adjacent to trenches 301 to remove a first one of the plurality of interfaces to create at least one lateral opening or seed window in each of the one or more trenches 301. FIG. 6 illustrates a top view of substrate 200 after additional longitudinal trenches 614 and 616 are etched. In one embodiment, additional longitudinal trenches 614 and 616 are etched on opposing sides of trenches 301. In one embodiment, additional longitudinal trenches 614 and 616 intersect with trenches 301, thus removing two of the plurality of vertical interfaces 504 to form lateral openings 605 and 606 on opposing sides of each trench 301. FIG. 7 illustrates a perspective view of the embodiment depicted in FIG. 6. In one embodiment, additional longitudinal trenches 614 and 616 are etched to a same depth of one or more trenches 301.

Figure 8:
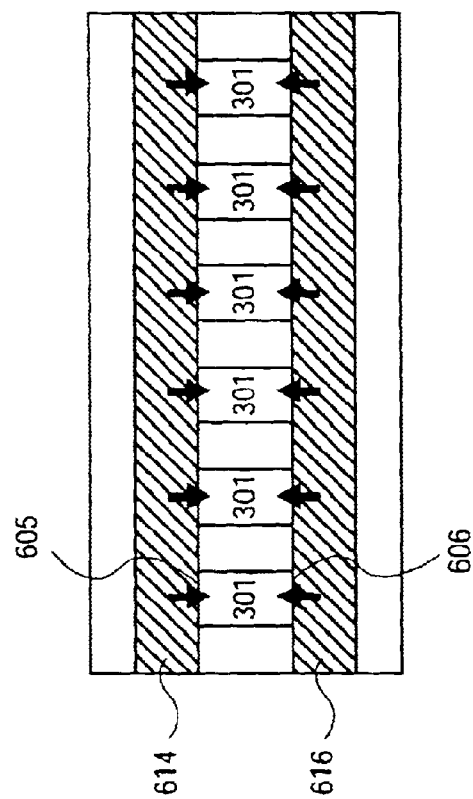

Next, as shown in FIG. 8 in a top down view of substrate 200, in an embodiment, single crystal silicon is laterally grown from additional longitudinal trenches 614 and 616 through lateral openings 605 and 606 into trenches 301 to form single crystal silicon regions in trenches 301 to form capacitive structures. In one embodiment, the process includes a selective epitaxial growth process including a chlorine containing gas such as for example, hydrogen chloride (HCl), silicon tetrachloride ($SiCl_4$), dichlorosilane ($SiH_2Cl_2$) or other suitable gas. In one embodiment, the selective epitaxial growth process is helpful to control silicon growth conditions so that polysilicon growth on insulating layer 453 is sufficiently suppressed relative to silicon-on-silicon growth so that the film grows laterally from the side. In one embodiment, once the bottom of one or more trenches 301 are covered with single crystal silicon, the growth rate of the single crystal silicon region can be increased.

Figure 9:
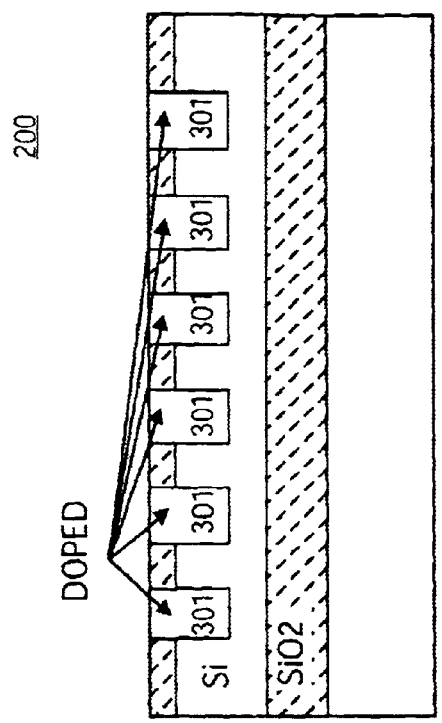

In one embodiment, the single crystal silicon is doped during the lateral growth of the single crystal silicon region into trenches 301. In one embodiment, the single crystal silicon is doped to an opposite n-type or p-type semiconductor of the first semiconductor material to allow both sides of the capacitive structure to operate in accumulation mode. In one embodiment, the single crystal silicon is doped by flowing an additional dopant gas during the lateral growth of the single crystal silicon region into trenches 301. In one embodiment, a dopant gas may include phosphine ($PH_3$) to dope the single crystal silicon with phosphorus. In one embodiment, in-situ doping is more efficient than a two-step implantation and dopant activation process that might occur for other types of materials used for regions 140 and 142. FIG. 9 illustrates a side view of substrate 200 after the doping and lateral growth of the single crystal silicon into trenches 301 in accordance with the teachings of the present invention. For clarity, additional longitudinal trenches 614 and 616 are not shown.

Figure 10:
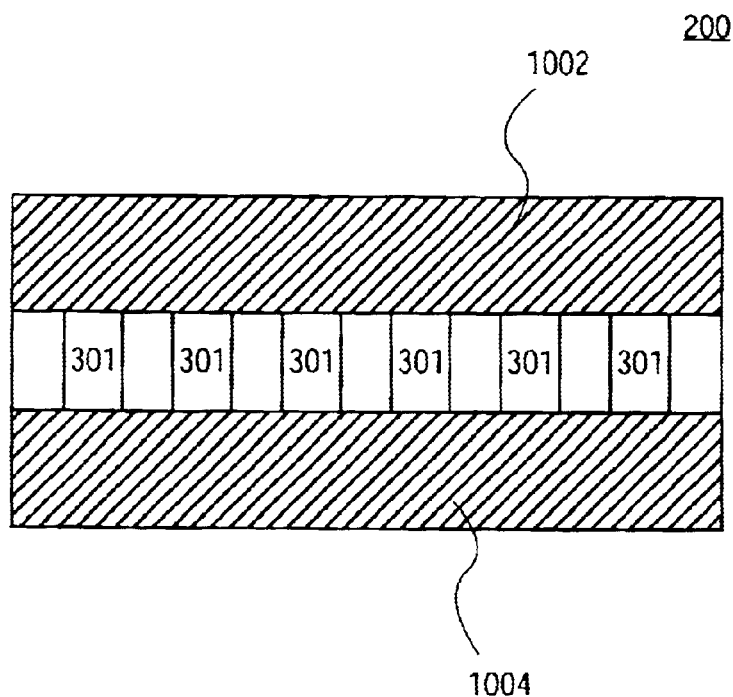

In one embodiment as illustrated in a top down view in FIG. 10, substrate 200 is patterned and etched to prevent shorting between the two sides of the capacitive structures. Areas 1002 and 1004 adjacent to trenches 301 are etched away. In one embodiment, the substrate after such etching may form an optical waveguide. For instance, in one embodiment, a rib waveguide is formed by etching away areas 1002 and 1004. In one embodiment, insulating layer 453 is an oxide and substrate 200 undergoes thermal oxidation to reform oxide on the corners and sidewalls of the capacitive structures that may have been damaged during etching processes.

Figure 11:
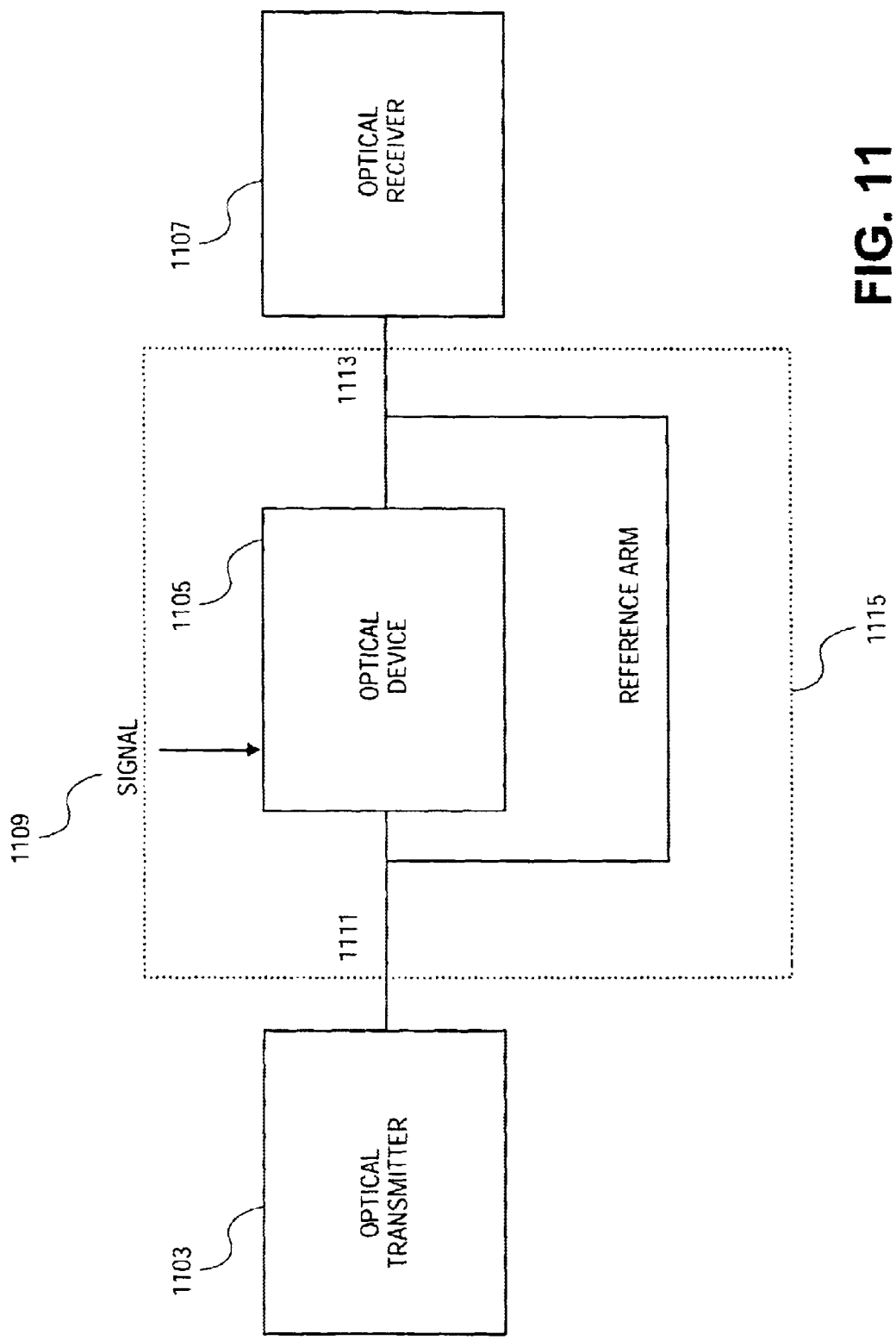
FIG. 11 is a block diagram illustration of one embodiment of a system including an optical transmitter and an optical receiver with an optical switching device according to embodiments of the present invention to modulate a phase of an optical beam directed from the optical transmitter to the optical receiver.

FIG. 11 is a block diagram illustration of one embodiment of a system including an optical transmitter and an optical receiver with an optical device according to embodiments of the present invention to modulate a phase of an optical beam directed from the optical transmitter to the optical receiver. In particular, FIG. 11 shows optical system 1101 including an optical transmitter 1103 and an optical receiver 1107. In one embodiment, optical system 1101 also includes an optical device 1105 optically coupled between optical transmitter 1103 and optical receiver 1107. As shown in FIG. 11, optical transmitter 1103 transmits an optical beam 1111 that is received by optical device 1105.

In one embodiment, optical device 1105 may be included in for example a Mach-Zehnder interferometer 1115 or another suitable device. As shown in the depicted embodiment, Mach-Zehnder interferometer 1115 includes optical device 1105 in one arm. Optical device 1105 may include a device such as optical switching device 134 of FIG. 1, or another suitable device in accordance with the teachings of the present invention. In various embodiments optical device 1105 may include one or more capacitive structures including a single crystal silicon region in accordance with the teachings of the present invention. As shown in the depicted embodiment, the other arm (e.g. reference arm) of Mach-Zehnder interferometer 1115 does not include optical device 1105. Accordingly, the phase of optical beam 1111 is modulated due to interference between the two arms of the Mach-Zehnder interferometer 1115 in response to a signal 1109 received by optical device 1105. Accordingly, the phase of optical beam 1111 is modulated due to interference between the two arms of the Mach-Zehnder interferometer 1115 in response to a signal 1109 received by optical device 1105. A modulated optical beam 1113 is then generated as a result from optical device 1105, which is then directed from optical device 1105 to optical receiver 1107. In another embodiment (not shown), optical device 1105 may be included in an optical switch to direct a light beam from optical transmitter 1103 to one of two or more different optical paths. In an embodiment, the optical beam may be received by optical receiver 1107 or another receiver in an optical network.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method, comprising:

etching one or more trenches in an optical waveguide disposed in a substrate including a first semiconductor material;

growing an insulating layer on an inside surface of the one or more trenches to form a plurality of interfaces between the insulating layer and the first semiconductor material in each of the one or more trenches;

etching an additional one or more longitudinal trenches adjacent to the one or more trenches to remove a first one of the plurality of interfaces to create at least one lateral opening in each of the one or more trenches; and laterally growing single crystal silicon through the at least one opening to form single crystal silicon in the one or more trenches.

2. The method of claim 1 wherein etching the additional one or more longitudinal trenches adjacent to the one or more trenches includes etching longitudinal trenches on opposing sides of the one or more trenches.

3. The method of claim 2 wherein the longitudinal trenches on opposing sides of the one or more trenches intersect with the one or more trenches.

4. The method of claim 1 wherein the at least one lateral opening comprises a seed window.

5. The method of claim 1 wherein growing the insulating layer comprises growing an oxide layer.

6. The method of claim 5 further comprising regrowing damaged oxide in the insulating layer via thermal oxidation of the substrate.

7. The method of claim 1 wherein laterally growing the single crystal silicon through the at least one lateral opening comprises filling the one or more trenches with the single crystal silicon to form a capacitive structure.

8. The method of claim 1 further comprising etching the substrate to form an optical rib waveguide.

9. The method of claim 1 wherein etching the one or more trenches comprises patterning a photoresist layer to form a mask.

10. The method of claim 1 wherein the substrate includes atop insulating layer above the first semiconductor material, the top insulating layer etched to form a hard mask over the first semiconductor material.

11. The method of claim 1 wherein etching the additional one or more trenches includes etching the additional one or more trenches to a substantially equal depth as the one or more trenches.

12. The method of claim 1 wherein laterally growing single crystal silicon comprises a selective epitaxial growth process including a chlorine-containing gas.

13. The method of claim 12 wherein the gas comprises at least one of hydrogen chloride, silicon tetrachloride, dichlorosilane and trichlorosilane.

14. The method of claim 1 further comprising doping the single crystal silicon while laterally growing the single crystal silicon in the one or more trenches.

* * * * *

UNITED STATES PATENT AND TRADEMARK OFFICE
CERTIFICATE OF CORRECTION

PATENT NO.     : 6,653,161 B1
DATED          : November 25, 2003
INVENTOR(S)    : Morse It is certified that error appears in the above-identified patent and that said Letters Patent is hereby corrected as shown below:

Column 9,
Line 4, delete "atop", insert -- a top --.

Signed and Sealed this

Twenty-fourth Day of February, 2004

JON W. DUDAS
*Acting Director of the United States Patent and Trademark Office*